(12) United States Patent
Qu et al.

(10) Patent No.: US 11,362,278 B2
(45) Date of Patent: Jun. 14, 2022

(54) METHOD OF FORMING ORGANIC LIGHT-EMITTING DISPLAY PANEL

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Litao Qu, Beijing (CN); Biao Tian, Beijing (CN); Jiewei Li, Beijing (CN); Langlang Ha, Beijing (CN); Shihlun Chen, Beijing (CN); Tao Jin, Beijing (CN); Jieshu Wu, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/022,880

(22) Filed: Sep. 16, 2020

(65) Prior Publication Data
US 2021/0083190 A1 Mar. 18, 2021

(30) Foreign Application Priority Data
Sep. 17, 2019 (CN) .......................... 201910876739.1

(51) Int. Cl.
*H01L 29/08* (2006.01)
*H01L 51/00* (2006.01)
(Continued)

(52) U.S. Cl.
CPC ...... *H01L 51/0016* (2013.01); *H01L 51/5228* (2013.01); *H01L 51/56* (2013.01);
(Continued)

(58) Field of Classification Search
CPC . H01L 51/0016; H01L 51/5228; H01L 51/56; H01L 51/5012; H01L 27/3246; H01L 2251/5315
(Continued)

(56) References Cited

U.S. PATENT DOCUMENTS

2008/0287028 A1 11/2008 Ozawa
2012/0080668 A1* 4/2012 Seki .................... H01L 51/5268
257/40
(Continued)

FOREIGN PATENT DOCUMENTS

CN 105409329 A 3/2016
CN 108172605 A 6/2018
(Continued)

*Primary Examiner* — Phuc T Dang
(74) *Attorney, Agent, or Firm* — Muncy, Geissler, Olds & Lowe, PC

(57) ABSTRACT

An organic light-emitting display panel, a method of forming the same and a display device are provided. The method of forming an organic light-emitting display panel includes: providing a base substrate; forming an auxiliary cathode at a side of the base substrate and forming a pixel defining layer at a side of the auxiliary cathode away from the base substrate; filling a negative thermal expandable ball into the groove; forming a light-emitting layer at the side of the base substrate; performing a heating treatment and a vibrating treatment on the base substrate with the light-emitting layer; and forming a cathode layer at a side of the light-emitting layer away from the base substrate.

15 Claims, 5 Drawing Sheets

(51) Int. Cl.
  *H01L 51/52* (2006.01)
  *H01L 51/56* (2006.01)
  *H01L 27/32* (2006.01)
  *H01L 51/50* (2006.01)

(52) U.S. Cl.
  CPC ...... *H01L 27/3246* (2013.01); *H01L 51/5012* (2013.01); *H01L 2251/5315* (2013.01)

(58) Field of Classification Search
  USPC .......................................................... 257/40
  See application file for complete search history.

(56) References Cited

U.S. PATENT DOCUMENTS

| | | |
|---|---|---|
| 2015/0021560 A1 | 1/2015 | Jeong et al. |
| 2016/0013438 A1* | 1/2016 | Im .......................... H01L 51/56 |
| | | 257/40 |
| 2016/0207146 A1 | 7/2016 | Nirengi et al. |
| 2019/0074338 A1* | 3/2019 | Gu ...................... H01L 51/5228 |
| 2019/0207149 A1 | 7/2019 | Yu |
| 2020/0194732 A1* | 6/2020 | Yao ...................... H01L 51/0016 |

FOREIGN PATENT DOCUMENTS

| | | |
|---|---|---|
| CN | 109524576 A | 3/2019 |
| CN | 109560117 A | 4/2019 |

\* cited by examiner

METHOD OF FORMING ORGANIC LIGHT-EMITTING DISPLAY PANEL

CROSS REFERENCE OF RELATED APPLICATION

The present disclosure claims a priority to Chinese Patent Application No. 201910876739.1 filed on Sep. 17, 2019, the disclosures of which are incorporated in their entirety by reference herein.

TECHNICAL FIELD

The present disclosure relates to field of touch technology, and in particular to an organic light-emitting display panel, a method of forming the same and a display device.

BACKGROUND

Organic electroluminescence (OLED) display technology has advantages such as self-luminescence, wide viewing angle, high contrast, low power consumption, extremely high response speed, ultra-lightweight and thin, soft display, rollable screen, strong temperature adaptability, simple manufacturing process, and has become a research hotspot in the field of optoelectronic display technology. Top-emission AMOLED (passive organic electroluminescent diode) may effectively solve the problems of reduced aperture ratio and reduced display brightness caused by complex TFT (thin film field effect transistor) compensation circuits. At the same time, by the microcavity effect of the top-emitting AMOLED device, it is able to improve the color gamut of the AMOLED display and improve the display effect. As the part which the top-emitting AMOLED must project, the transmittance and conductivity of the transparent cathode are crucial factors. When the cathode is made of materials such as indium tin oxide and indium zinc oxide with higher transparency, the resistance of the cathode is relatively large, which is likely to cause a large difference in the driving voltage between the center area and the edge area of the screen, that is, a large voltage drop will occur. As the size of the display panel increases, the voltage drop of the cathode is significant, resulting in uneven display brightness. Therefore, it is necessary to increase the conductivity by setting an auxiliary cathode to improve the display quality of the screen.

However, the organic light-emitting display panel and the method of forming the same and the display device in the related art still need to be improved.

SUMMARY

A method of forming an organic light-emitting display panel is provided, including:

providing a base substrate;

forming an auxiliary cathode at a side of the base substrate, and forming a pixel defining layer at a side of the auxiliary cathode away from the base substrate, where the pixel defining layer defines a plurality of sub-pixel regions on the base substrate, the pixel defining layer has a groove penetrating the pixel defining layer, and an orthographic projection of the groove onto the base substrate is within an orthographic projection of the auxiliary cathode onto the base substrate, to exposure at least a part of the auxiliary cathode;

filling a negative thermal expandable ball into the groove, where a volume of the negative thermal expandable ball is capable of decreasing with an increasing of temperature;

forming a light-emitting layer at the side of the base substrate, where the light-emitting layer covers a surface of the pixel defining layer away from the base substrate and covers a surface of the negative thermal expandable ball away from the base substrate;

performing a heating treatment and a vibrating treatment on the base substrate with the light-emitting layer to shrink the negative thermal expandable ball to enable the negative thermal expandable ball to fall from the groove and to fracture the light-emitting layer covering the surface of the negative thermal expandable ball; and forming a cathode layer at a side of the light-emitting layer away from the base substrate, where the cathode layer is electrically connected to the auxiliary cathode at the groove.

Optionally, a width of the groove is 98% to 99% of a diameter of the negative thermal expandable ball.

Optionally, a diameter of the negative thermal expandable ball is not more than twice a depth of the groove.

Optionally, the diameter of the negative thermal expandable ball is 5 μm to 6 μm, and the depth of the groove is 2.5 μm to 3.5 μm.

Optionally, an expansion coefficient of the negative thermal expandable ball is $(-0.8) \times 10^3$ to $(-1.3) \times 10^{-3} K^{-1}$.

Optionally, the forming the light-emitting layer further includes:

evaporating a light-emitting layer material at the side of the base substrate to form the light-emitting layer, where an evaporation temperature is not greater than 40° C.

Optionally, the heating treatment includes increasing an evaporation temperature to 90° C. to 100° C.

Optionally, the vibrating treatment includes a pressure blowing treatment or an ultrasonic vibrating treatment.

Optionally, the groove is between two adjacent sub-pixel regions and a side wall of the groove is perpendicular to the base substrate, and a cross section of the groove in a direction perpendicular to the base substrate is a rectangle or square.

Optionally, a non-pixel region is between adjacent sub-pixel regions on the base substrate, and the auxiliary cathode is at the non-pixel region.

Optionally, the filling the negative thermal expandable ball into the groove further includes: filling the negative thermal expandable ball into the groove by a dispensing method.

Optionally, a material of the negative thermal expandable ball includes a composite material of ceram and metal.

Optionally, subsequent to the filling the negative thermal expandable ball into the groove and prior to the forming the light-emitting layer at the side of the base substrate, the method further includes forming an anode layer at the sub-pixel regions of the base substrate.

Optionally, prior to the evaporating the light-emitting layer material at the side of the base substrate, the method further includes: turning over the base substrate provided with the negative thermal expandable ball.

Optionally, the cathode layer is in direct contact with the auxiliary cathode at the groove, and the cathode layer is in direct contact with the pixel defining layer and the light-emitting layer.

An organic light-emitting display panel is further provided, including:

a base substrate;

an auxiliary cathode at a side of the base substrate;

a pixel defining layer at a side of the auxiliary cathode away from the base substrate and covering a part of the auxiliary cathode, where the pixel defining layer has a groove penetrating the pixel defining layer, and an orthographic projection of the groove onto the base substrate is within an orthographic projection of the auxiliary cathode onto the base substrate;

an anode layer at a side of the base substrate;

a light-emitting layer at a side of the anode layer away from the base substrate; and a cathode layer at a side of the light-emitting layer away from the anode layer, where the cathode layer covers the pixel defining layer and extends into the groove to be electrically connected to the auxiliary cathode.

Optionally, the groove is between two adjacent sub-pixel regions and a side wall of the groove is perpendicular to the base substrate, and a cross section of the groove in a direction perpendicular to the base substrate is a rectangle or square.

Optionally, a non-pixel region is between adjacent sub-pixel regions on the base substrate, and the auxiliary cathode is at the non-pixel region.

Optionally, the cathode layer is in direct contact with the auxiliary cathode at the groove, and the cathode layer is in direct contact with the pixel defining layer and the light-emitting layer.

A display device including the organic light-emitting display panel formed by the method hereinabove is further provided.

DETAILED DESCRIPTION

Figure 1:
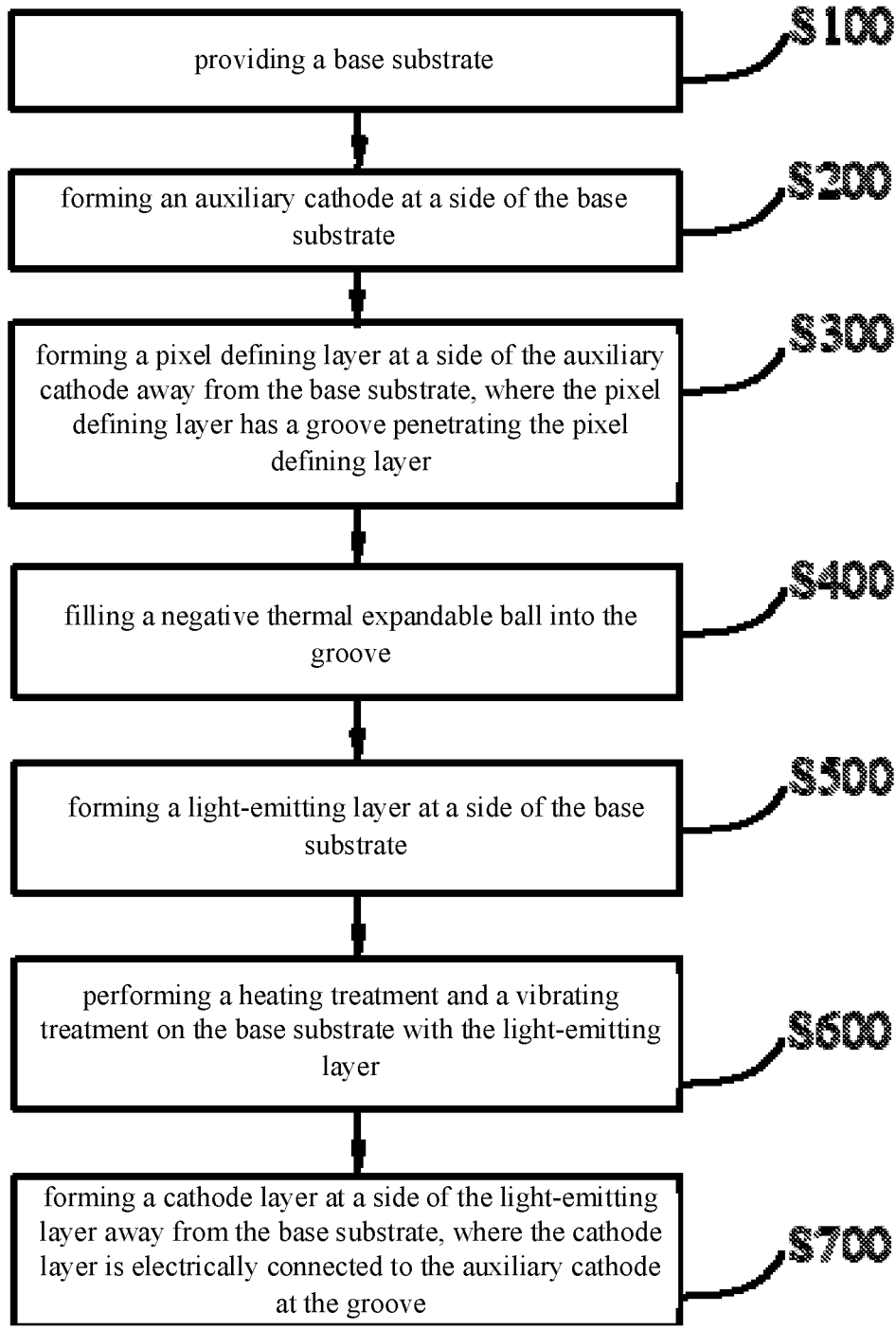
FIG. 1 is a flow chart of a method of forming an organic light-emitting display panel in an embodiment of the present disclosure.

The embodiments of the present disclosure will be described in detail below. The embodiments are shown in the drawings, where the same or similar reference numerals indicate the same or similar elements or elements with the same or similar functions. The embodiments described below with reference to the drawings are exemplary, and are only used to explain the present disclosure, but shall not be taken as limiting the present disclosure.

It is found that the method of forming an auxiliary cathode in top-emitting AMOLED (passive organic electroluminescent diodes) in the related art generally has problems such as complicated manufacturing processes and poor electrical connection performance between the manufactured auxiliary cathode and the cathode layer. In the top-emission AMOLED process in the related art, in order to prevent the auxiliary cathode from affecting the light transmittance of the top-emission, the auxiliary cathode is usually only arranged in the region corresponding to the pixel defining layer. The auxiliary cathode may be arranged on the organic light-emitting display back plate or the organic light emitting display cover plate. When the auxiliary cathode is arranged on the organic light-emitting display back plate, it is usually necessary to design via holes and complicated wiring to electrically connect the auxiliary cathode and the cathode, and there is also the risk of short circuit of the wiring. When the auxiliary cathode is arranged on the organic light-emitting display cover plate, since the back plate and the cover plate need to be encapsulated to form a cell, there is a certain pressing force at this time, which make the conductive material (such as ITO) arranged around the spacer easy to be broken, causing the auxiliary cathode to be disconnected with the cathode, and the auxiliary cathode cannot function effectively, and the broken ITO may easily crush the cathode, causing black spots, thereby lowering the performance of the organic light-emitting display panel and the product yield, etc. Therefore, if a new method of forming an organic light-emitting display panels can be proposed, the auxiliary cathode and the cathode layer may be electrically connected simply and effectively, which will simplify the forming process and improve the product yield, which will largely solve the above technical issue.

In one aspect of the present disclosure, a method of forming an organic light-emitting display panel is provide in the present disclosure. In an embodiment of the present disclosure, an auxiliary cathode is formed at a side of the base substrate, and a pixel defining layer is formed at a side of the auxiliary cathode away from the base substrate. A groove is formed at a side of the pixel defining layer away from the base substrate. The groove exposes the auxiliary cathode formed at a side of the base substrate. By setting the negative thermal expandable ball in the groove, the negative thermal expandable ball may shield the groove, and when the light-emitting layer is subsequently formed, the light-emitting layer will not be formed in the groove. After the light-emitting layer is formed and before forming the cathode layer, the negative thermal expandable ball shrinks in volume after being heated and falls out of the groove, and then the light-emitting layer covering the surface of the negative thermal expandable ball is fractured. When the cathode layer is subsequently formed, the cathode layer may be directly contacted and electrically connected with the auxiliary cathode at the groove. Therefore, the electrical connection between the auxiliary cathode and the cathode may be easily realized, and the electrical connection between the auxiliary cathode and the cathode is more reliable, which improves the product yield, and the formed organic light-emitting display panel has a better brightness uniformity and good performance.

In an embodiment of the present disclosure, referring to FIG. 1, the method includes:

S100: providing a base substrate.

In this step, a base substrate is provided. In an embodiment of the present disclosure, referring to FIG. 2(a), the type of the base substrate 100 is not particularly limited. For example, the base substrate 100 may include a plurality of layers of structure, for example, may include a glass substrate and also structures such as multilayer thin film transistors (TFT) and capacitors formed on a base substrate, and may also include a planarization layer disposed above structures such as multilayer thin film transistors (TFT). For example, the base substrate 100 may include a buffer layer (Buffer), an active layer (p-Si), a gate insulating layer (GI), a gate, an interlayer insulating layer (ILD), a source drain (SD) and a planarization layer (PLN) arranged in sequence at a side of the base substrate. For example, the base substrate may also include two gates, that is, it may include a first gate insulating layer (GI1), a first gate (Gate1), an active layer (p-Si), a second gate insulating layer (GI2), a second gate (Gate2) arranged in sequence. Specifically, the base substrate 100 may have multiple sub-pixel regions arranged in an array, and non-pixel regions located between the sub-pixel regions.

S200: forming an auxiliary cathode at a side of the base substrate.

In this step, an auxiliary cathode is formed at a side of the base substrate. In an embodiment of the present disclosure, referring to (b) in FIG. 2, an auxiliary cathode 200 is formed at a side of the base substrate 100. Specifically, as described above, in order to prevent the auxiliary cathode 200 from affecting the top emission transmittance of the final organic light-emitting display panel, the auxiliary cathode 200 is formed in the non-pixel region of the base substrate 100 described above. Specifically, the material and forming method of the auxiliary cathode 200 are not particularly limited. For example, the metal may be deposited/sputtered at a side of the base substrate 100, and then an auxiliary cathode 200 is formed at a side of the base substrate 100 by a patterning processes (photoresist coating, exposure and development, etching and photoresist stripping).

S300: forming a pixel defining layer at a side of the auxiliary cathode away from the base substrate, where the pixel defining layer defines a plurality of sub-pixel regions on the base substrate, the pixel defining layer has a groove penetrating the pixel defining layer.

In this step, a pixel defining layer is formed at a side of the auxiliary cathode formed in the previous step away from the base substrate. In an embodiment of the present disclosure, referring to FIG. 2(c), a pixel defining layer 300 is formed at a side of the auxiliary cathode 200 away from the base substrate 100. The pixel defining layer 300 defines a plurality of sub-pixel regions 110 on the base substrate 100 (Referring to the two sub-pixel regions 110A and 110B shown in FIG. 2(c)), the side of the pixel defining layer 300 away from the base substrate 100 has a penetrating grooves 310. An orthographic projection of the groove 310 onto the base substrate 100 is within an orthographic projection of the auxiliary cathode 200 onto the base substrate 100, to exposure at least a part of the auxiliary cathode 200. Specifically, the method of forming the pixel defining layer 300 is not particularly limited. For example, a mask may be provided at a side of the auxiliary cathode 200 away from the base substrate 100, and the mask may cover the regions where the groove 310 is subsequently to be formed, and then the pixel defining layer material is coated at a side of the auxiliary cathode 200 away from the base substrate 100, and then the pixel defining layer 300 is formed through an exposure and development process, and then the mask is removed to form a penetrating groove 310 in the pixel defining layer 300, to expose the auxiliary cathode 200. Specifically, the groove 310 may be a right-angle groove, that is, the cross section of the groove 310 along (c) in FIG. 2 is a square (rectangular or square), thereby making the negative thermal expandable ball better embedded in the groove 310, and when the negative thermal expandable ball is heated and shrinks in volume, it is easy to fall out of the right angle groove 310.

S400: filling a negative thermal expandable ball into the groove.

In this step, the negative thermal expandable ball is filled in the groove formed in the previous step. In an embodiment of the present disclosure, referring to FIG. 2(d), the negative thermal expandable ball 400 is filled in the groove in the pixel defining layer 300. Specifically, the negative thermal expandable ball 400 may be filled in the groove by the dispensing method. A volume of the negative thermal expandable ball 400 is capable of decreasing with an increasing of temperature, for example, at a room temperature, the volume of negative thermal expandable ball 400 is relatively large, and can be just embedded into the groove (cannot fall out of the groove). When the temperature rises, the volume of the negative thermal expandable ball 400 decreases. When the temperature rises to a certain level, the volume of the negative thermal expandable ball 400 decreases to a certain extent, and then the negative thermal expandable ball 400 may fall out of the groove. Specifically, the negative thermal expandable ball 400 may have certain elasticity, thereby making the negative thermal expandable ball 400 to be better embedded in the groove.

Figure 2:
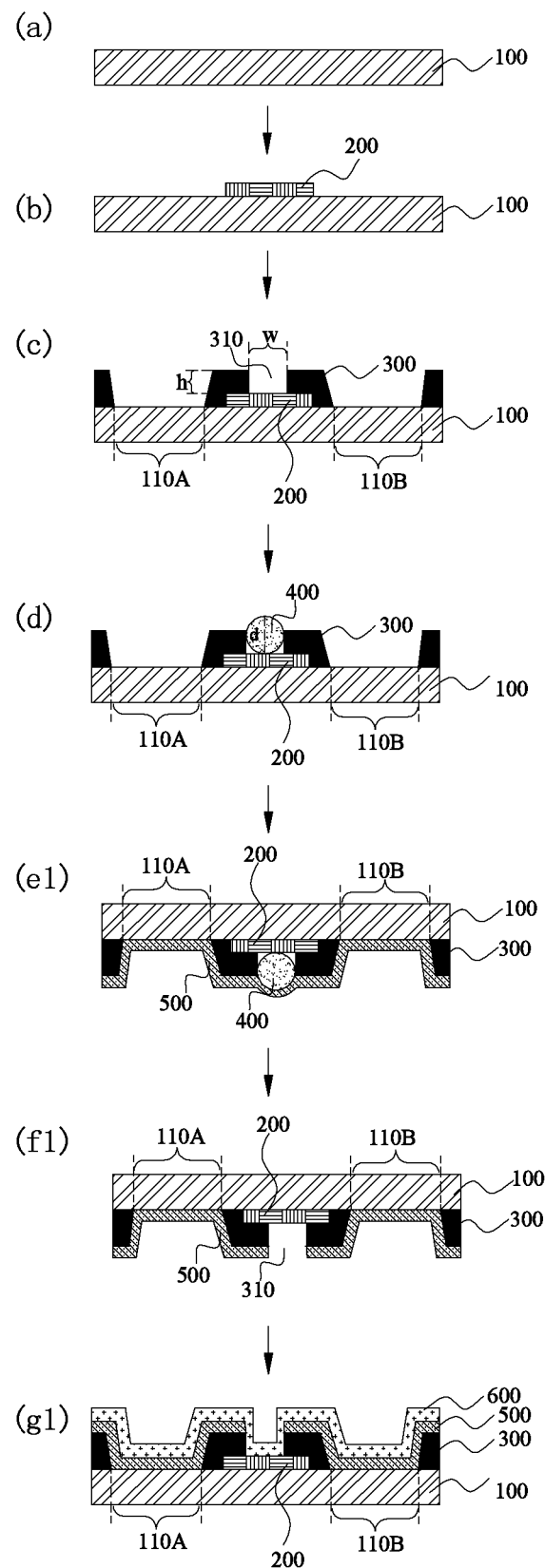
FIG. 2 shows a flowchart of a method of forming an organic light-emitting display panel in an embodiment of the present disclosure.

In an embodiment of the present disclosure, referring to (c) in FIG. 2 and (d) in FIG. 2, a width w of the groove 310 may be 98-99% of a diameter d of the negative thermal expandable ball 400, for example, it may be 98.5% or 98.7%, etc. It should be noted that the "diameter d of the negative thermal expandable ball 400" mentioned above refers to the diameter of the negative thermal expandable ball 400 at the room temperature. Therefore, since the negative thermal expandable ball 400 has elasticity, the negative thermal expandable ball 400 may be interference fit with the groove 310, and the negative thermal expandable ball 400 and the groove 310 are tightly bonded, even if the base substrate 100 is vibrated (for example, the base substrate 100 is cleaned or vibrated before forming the light-emitting layer in a subsequent step), and the negative thermal expandable ball 400 will not fall out of the groove 310. The light-emitting layer is formed in the subsequent step. At this time, even if the temperature rises slightly (for example, more than ten degrees from room temperature), and in order to facilitate the formation of a light-emitting layer by evaporation, the base substrate 100 will be turned upside down, although the volume of the negative thermal expandable ball 400 may shrink, but it can still fit tightly with the groove 310 (that is, the adhesion between the negative thermal expandable ball 400 and the sidewall of the groove 310 is greater than the gravity of the negative thermal expandable ball 400), that is, the negative thermal expandable ball 400 will not fall out of the groove 310, thereby further improving the performance of the formed organic light-emitting display panel.

In an embodiment of the present disclosure, a diameter d of the negative thermal expandable ball 400 may be less than or equal to twice a depth h of the groove 310. Therefore, the negative thermal expandable ball 400 may be better embedded in the groove 310, and the negative thermal expandable ball 400 and the groove 310 are tightly connected, and the negative thermal expandable ball 400 will not fall out of the groove. Specifically, the diameter d of the negative thermal expandable ball 400 may be 5-6 μm, for example, 2.5 μm, and the depth h of the groove 310 may be 2.5-3.5 μm, for example, 3 μm. Thus, the performance of the formed organic light-emitting display panel is further improved.

In an embodiment of the present disclosure, the coefficient of expansion (CTE) of the negative thermal expandable ball 400 may be $(-0.8) \times 10^3$ to $(-1.3) \times 10^{-3} K^{-1}$, for example, It is $(-1) \times 10^{-3} K^{-1}$, $(-1.2) \times 10^{-3} K^{-1}$, etc. Therefore, if the expansion coefficient of the negative thermal expandable ball 400 is in the above range, when the temperature rises to a certain level, the volume shrinkage of the negative thermal expandable ball 400 may be greater, that is, the shrunk negative thermal expandable ball 400 may fall out of the groove 310, to make the cathode layer formed subsequently to be directly electrically connected to the auxiliary cathode 200 at the groove 310, which further improves the performance of the formed organic light-emitting display panel.

According to the embodiment of the present disclosure, when the temperature rises from the room temperature to (90~100)° C., for example to (90~95)° C., the diameter shrinkage range of the negative thermal expandable ball 400 having the above expansion coefficient may be 97% to 98% (that is, the percentage between the diameter of the negative thermal expandable ball 400 after volume shrinkage and the diameter of the ball at room temperature), for example, 97.5%, 97.8%, etc. Therefore, when the temperature rises from room temperature to (90~95)° C., the shrunk negative thermal expandable ball 400 with the above expansion coefficient may fall out of the groove 310 (e.g., the width of the groove 310 is 98% to 99% of the diameter of the negative thermal expandable ball at the room temperature), which facilitates the subsequent formed cathode layer to be directly electrically connected to the auxiliary cathode 200 at the groove 310, thereby improving the performance of the formed organic light-emitting display panel.

Specifically, the material of forming the negative thermal expandable ball 400 is not limited. For example, the material of forming the negative thermal expandable ball 400 may include a composite material of ceramic and metal, such as a ceramic-metal composite composed of calcium, ruthenium, and oxygen atoms, with a CTE of $(-1.3) \times 10^{-3} K^{-1}$, the volume of the material may be shrunk by 6.7% when being heated (the temperature rises from room temperature to 90° C.) (its diameter is shrunk to the 97% of original diameter, correspondingly, the volume of the ball is shrunk by 6.7%) and so on.

It should be noted that the expansion coefficient of the negative thermal expandable ball 400 and the ratio between the width w of the groove 310 described above and the diameter d of the negative thermal expandable ball 400 are related, when the expansion coefficient of the negative thermal expandable ball 400 is large, that is, when the temperature rises, the volume shrinkage rate of the negative thermal expandable ball 400 is large, and the ratio of the width w of the groove 310 to the diameter d of the negative thermal expandable ball 400 may be small. In this way, when the temperature rises slightly (for example, the temperature rises more than ten degrees from room temperature as described above), the negative thermal expandable ball 400 will not fall out of the groove 310 due to a large volume shrinkage. By the expansion coefficient of the expandable ball, an appropriate ratio of the groove width w and the diameter d of the negative thermal expandable ball may be determined, so that the negative thermal expandable ball may fall out of the groove after the functional layer such as the light-emitting layer is formed and before forming the cathode layer, thereby further improving the performance of the formed organic light-emitting display panel. According to the embodiment of the present disclosure, when a ceramic-metal composite material composed of calcium, ruthenium, and oxygen atoms (CTE is $(-1.3) \times 10^{-3} K^{-1}$) is used to make negative thermal expandable ball 400, the diameter d of the negative thermal expandable ball 400 may be 6 μm, the depth h of the groove 310 may be 3 μm, and the width w of the groove 310 may be 5.9 μm.

Figure 3:
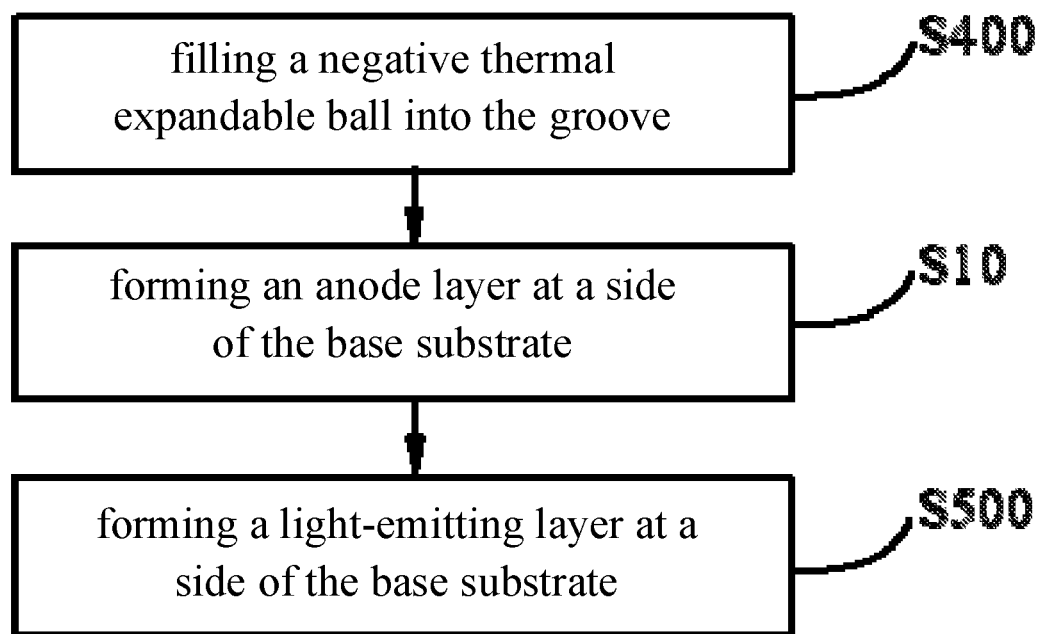
FIG. 3 is a flow chart of a method of forming an organic light-emitting display panel in an embodiment of the present disclosure.
Figure 4:
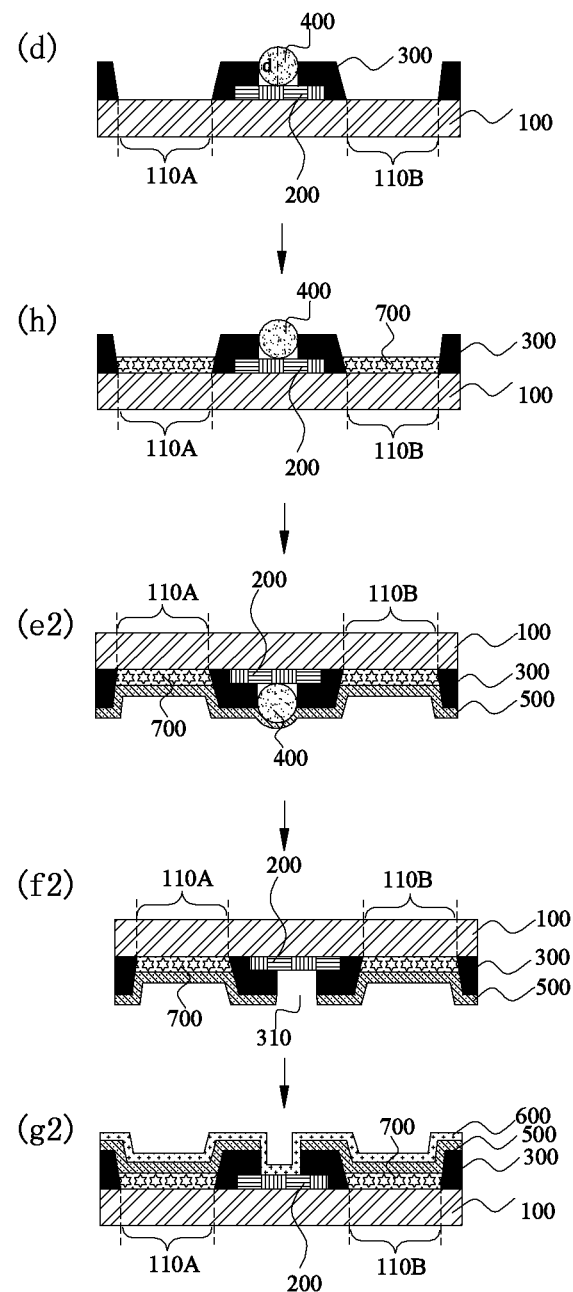
FIG. 4 is a flow chart of a method of forming an organic light-emitting display panel in an embodiment of the present disclosure.

In an embodiment of the present disclosure, in order to further improve the usability of the formed organic light-emitting display panel, referring to FIG. 3 and FIG. 4, after the negative thermal expandable ball is filled in the groove, the method may further include:

S10: forming an anode layer at a side of the base substrate.

In this step, an anode layer is formed at a side of the base substrate. In an embodiment of the present disclosure, referring to (h) in FIG. 4, the anode layer 700 is formed at a side of the base substrate 110. Specifically, the anode layer 700 may be formed in the sub-pixel region 110. Specifically, when the anode layer 700 is formed, the temperature may not be greater than 40° C. Therefore, the temperature when the anode layer 700 is formed is relatively low, and the volume of the negative thermal expandable ball 400 is not shrunk or shrunk less, and the negative thermal expandable ball will not fall out of the groove 310.

S500: forming a light-emitting layer at a side of the base substrate.

In this step, after the negative thermal expandable ball is filled in the groove in the previous step, or after the anode layer is formed in the previous step, a light-emitting layer may be formed at a side of the base substrate. In an embodiment of the present disclosure, referring to (e1) in FIG. 2 and (e2) in FIG. 4, a light-emitting layer 500 is formed at a side of the base substrate 100, and the light-emitting layer 500 is formed in the sub-pixel region 110 and covers the surface of the pixel defining layer 300 at the side away from the base substrate 100 and the surface of the negative thermal expandable ball 400 at the side away from the base substrate 100. Specifically, the method of forming the light-emitting layer 500 is not limited. For example, it may be formed by inkjet printing, or may be formed by an evaporation process. Specifically, when the light-emitting layer 500 is formed by an evaporation process, the base substrate 100 filled with the negative thermal expandable ball 400 formed in the previous step may be turned upside down (refer to FIG. 2(*e*1) and FIG. 4(*e*2)). Then, the light-emitting layer material is evaporated at a side of the base substrate 100 to form the light-emitting layer 500. Specifically, the evaporation temperature may not be greater than 40° C. Therefore, the temperature when the light-emitting layer 500 is formed is relatively low, which is slightly higher than the room temperature, and the volume shrinkage of the negative thermal expandable ball 400 is small, and the negative thermal expandable ball 400 will not fall out of the groove 310. As mentioned above, after the negative thermal expandable ball 400 is filled into the groove 310 in the previous step, the negative thermal expandable ball 400 may fit closely with the groove 310 even if the temperature rises slightly (for example, the temperature rises from room temperature to the evaporation temperature in the step), although the negative thermal expandable ball 400 is shrunk, it may still fit closely with the groove 310 (that is, the adhesion between the negative thermal expandable ball 400 and the sidewall of the groove 310 is greater than the gravity of the negative thermal expandable ball 400), that is, the negative thermal expandable ball 400 will not fall out of the groove 310. Thus, the light-emitting layer 500 may be formed on the surface of the pixel defining layer 300 away from the base substrate 100 and the surface of the negative thermal expandable ball 400 away from the base substrate 100, thereby further improving the performance of the formed organic light-emitting display panel.

Specifically, the light-emitting layer 500 is formed of light-emitting materials, and the colors of the light-emitting materials formed in the plurality of sub-pixel regions 110 may be different, for example, red light-emitting materials, green light-emitting materials, and blue light-emitting materials, respectively. Specifically, the light-emitting layer 130 may also be formed of the same light-emitting material, for example, a white light-emitting material, and the cover plate with a color filter may be used in conjunction with the organic light-emitting display panel formed by this method to achieve a color display.

S600: performing a heating treatment and a vibrating treatment on the base substrate with the light-emitting layer.

In this step, the base substrate with the light-emitting layer is heated and vibrated, so that the shrunk negative thermal expandable ball may fall out of the groove, to make the light-emitting layer covering the surface of the negative thermal expandable ball to be fractured. According to the embodiment of the present disclosure, referring to (f1) in FIG. 2 and (f2) in FIG. 4, the base substrate 100 with the light-emitting layer 500 is heated and vibrated. Specifically, the heating may include raising the temperature from the evaporation temperature described in the previous step to 90-100° C. Specifically, the base substrate 100 with the light-emitting layer 500 may be placed in a high-temperature environment and heated. Therefore, when the temperature rises to this temperature range, the volume shrinkage of the negative thermal expandable ball 400 is greater (for example, referring to the previous description, when the temperature rises from the room temperature to (90-100)° C., the diameter shrinkage of the negative thermal expandable ball 400 may range from 97% to 98%), it will fall out of the groove 310, and the light-emitting layer 500 covering the surface of the negative thermal expandable ball 400 will be fractured (the light-emitting layer 500 covering the surface of the negative thermal expandable ball 400 is very thin and easy to be fractured), and the auxiliary cathode 200 corresponding to the groove 310 may be exposed, so that the subsequent formed cathode layer is directly electrically connected to the auxiliary cathode 200 at the groove 310, thereby further improving the performance of the formed organic light-emitting display panel. In an embodiment of the present disclosure, the vibrating treatment may include: a pressure blowing treatment or an ultrasonic vibrating treatment, for example, the negative expansion ball 400 and the pixel defining layer 300 may be separated by a nitrogen pressure blowing process. Thereby, the shrunk negative thermal expandable ball 400 may easily fall out of the groove 310, and when the negative thermal expandable ball 400 falls out, the light-emitting layer 500 covering the surface of the negative thermal expandable ball 400 may be fractured. Specifically, as mentioned above, the groove 310 may be a right-angle groove. Therefore, when the negative thermal expandable ball 400 falls out of the groove 310, the right-angle groove 310 may simply cut off the light-emitting layer 500 covering the surface of the negative thermal expandable ball 400.

S700: forming a cathode layer at a side of the light-emitting layer away from the base substrate, where the cathode layer is electrically connected to the auxiliary cathode at the groove.

In this step, a cathode layer is formed at a side of the light-emitting layer away from the base substrate. In an embodiment of the present disclosure, referring to (g1) in FIG. 2 and (g2) in FIG. 4, a cathode layer 600 is formed at a side of the light-emitting layer 500 away from the base substrate 100, and the cathode layer 600 is electrically connected to the auxiliary cathode 200 at the groove 310. Specifically, a cathode layer material, such as indium tin oxide (ITO), etc., may be evaporated at a side of the light-emitting layer 500 away from the base substrate 100 to form the cathode layer 600. Thus, the electrical connection between the cathode layer 600 and the auxiliary cathode 200 may be easily realized, and the electrical connection between the auxiliary cathode 200 and the cathode layer 600 is relatively reliable, and the formed organic light-emitting display panel has a better performance.

Figure 5:
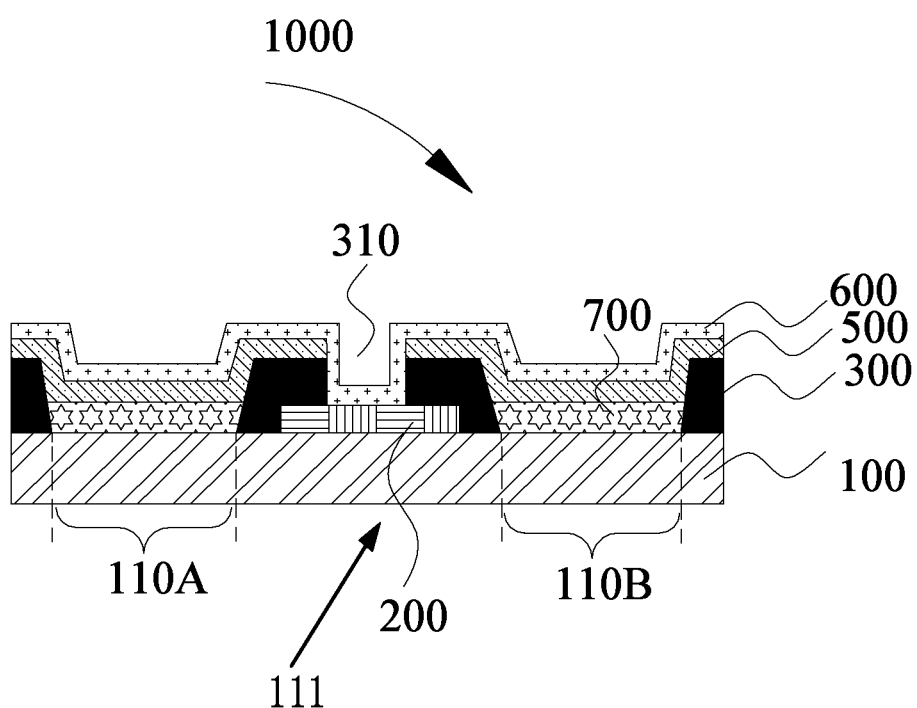
FIG. 5 is a schematic view of an organic light-emitting display panel in an embodiment of the present disclosure.

Optionally, as shown in FIG. 5, the cathode layer 600 is in direct contact with the auxiliary cathode 200 at the groove 310, and the cathode layer 600 is in direct contact with the pixel defining layer 300 and the light-emitting layer 500.

According to the embodiment of the present disclosure, an auxiliary cathode is formed at a side of the base substrate, and a pixel defining layer is formed at a side of the auxiliary cathode away from the base substrate. A groove is formed at a side of the pixel defining layer away from the base substrate. The groove exposes the auxiliary cathode formed at a side of the base substrate. By setting the negative thermal expandable ball in the groove, the negative thermal expandable ball may shield the groove, and when the light-emitting layer is subsequently formed, the light-emitting layer will not be formed in the groove. After the light-emitting layer is formed and before forming the cathode layer, the negative thermal expandable ball shrinks in volume after being heated and falls out of the groove, and then the light-emitting layer covering the surface of the negative thermal expandable ball is fractured. When the cathode layer is subsequently formed, the cathode layer may be directly contacted and electrically connected with the auxiliary cathode at the groove. Therefore, the electrical connection between the auxiliary cathode and the cathode may be easily realized, and the electrical connection between the auxiliary cathode and the cathode is more reliable, which improves the product yield, and the formed organic light-emitting display panel has a better brightness uniformity and good performance.

In another aspect of the present disclosure, an organic light-emitting display panel is further provided in the present disclosure. In an embodiment of the present disclosure, referring to FIG. 5, the organic light-emitting display panel 1000 includes a base substrate 100, an auxiliary cathode 200, a pixel defining layer 300, an anode layer 700, a light-emitting layer 500, and a cathode layer 600, where the auxiliary cathode 200 is at a side of the base substrate 100, the pixel defining layer 300 is at a side of the auxiliary cathode 200 away from the base substrate 100 and covers a part of the auxiliary cathode 200, and the side of the pixel defining layer 300 away from the base substrate 100 has a penetrating groove 310, the orthographic projection of the groove 310 onto the base substrate 100 is within the orthographic projection of the auxiliary cathode 200 onto the base substrate 100, the anode layer 700 is arranged at a side of the base substrate 100, and the light-emitting layer 500 is arranged at a side of the anode layer 700 away from the base substrate 100, the cathode layer 600 is at a side of the light-emitting layer 500 away from the anode layer 700, and the cathode layer 600 covers the pixel defining layer 300 and extends into the groove 310 to be electrically connected to the auxiliary cathode 200. Therefore, in the organic light-emitting display panel 1000, the auxiliary cathode 200 and the cathode layer 600 are directly electrically connected at the groove 310, the forming process is simple, and the electrical connection between the auxiliary cathode 200 and the cathode layer 600 is relatively reliable, and the performance of the light-emitting display panel 1000 is better.

Optionally, as shown in FIG. 5, the groove 310 is between two adjacent sub-pixel regions 110 and a side wall of the groove 310 is perpendicular to the base substrate 100, and a cross section of the groove 310 in a direction perpendicular to the base substrate 100 is a rectangle or square.

Optionally, as shown in FIG. 5, a non-pixel region 111 is between adjacent sub-pixel regions 110 on the base substrate 100, and the auxiliary cathode 200 is at the non-pixel region 111.

Optionally, as shown in FIG. 5, the cathode layer 600 is in direct contact with the auxiliary cathode 200 at the groove 310, and the cathode layer 600 is in direct contact with the pixel defining layer 300 and the light-emitting layer 500.

In another aspect of the present disclosure, a display device is provided in the present disclosure. In an embodiment of the present disclosure, the display device includes the organic light-emitting display panel formed by the aforementioned method or the aforementioned organic light-emitting display panel. Therefore, the display device has all the features and beneficial effects of the organic light-emitting display panel formed by the aforementioned method or the aforementioned organic light-emitting display panel, which will not be repeated here. In general, the display device has a uniform display brightness, a good display performance and a low power consumption.

In the present disclosure, the indicated orientation or positional relationship is based on the orientation or positional relationship shown in the drawings, which is only for the convenience of describing the present disclosure and does not require that the present disclosure must be constructed and operated in a specific orientation, so it should not be understood as limiting the present disclosure.

In the present disclosure, the description with reference to the terms "one embodiment", "another embodiment", etc. means that the specific feature, structure, material or characteristic described in conjunction with the embodiment is included in at least one embodiment of the present disclosure. In this specification, the schematic representations of the above-mentioned terms do not necessarily refer to the same embodiment or example. Moreover, the described specific features, structures, materials or characteristics can be combined in any one or more embodiments or examples in a suitable manner. In addition, those skilled in the art can combine and combine the different embodiments or examples and the characteristics of the different embodiments or examples described in this specification without contradicting each other.

Although the embodiments of the present disclosure have been shown and described above, it can be understood that the above embodiments are exemplary and should not be construed as limiting the present disclosure. A person of ordinary skill in the art may make changes, modifications, replacements and modifications on the above-mentioned embodiments within the scope of the present disclosure.

What is claimed is:

1. A method of forming an organic light-emitting display panel, comprising:
providing a base substrate;
forming an auxiliary cathode at a side of the base substrate, and forming a pixel defining layer at a side of the auxiliary cathode away from the base substrate, wherein the pixel defining layer defines a plurality of sub-pixel regions on the base substrate, the pixel defining layer has a groove penetrating the pixel defining layer, and an orthographic projection of the groove onto the base substrate is within an orthographic projection of the auxiliary cathode onto the base substrate, to exposure at least a part of the auxiliary cathode;
filling a negative thermal expandable ball into the groove, wherein a volume of the negative thermal expandable ball is capable of decreasing with an increasing of temperature;
forming a light-emitting layer at the side of the base substrate, wherein the light-emitting layer covers a surface of the pixel defining layer away from the base substrate and covers a surface of the negative thermal expandable ball away from the base substrate;
performing a heating treatment and a vibrating treatment on the base substrate with the light-emitting layer to shrink the negative thermal expandable ball to enable the negative thermal expandable ball to fall from the groove and to fracture the light-emitting layer covering the surface of the negative thermal expandable ball; and
forming a cathode layer at a side of the light-emitting layer away from the base substrate, wherein the cathode layer is electrically connected to the auxiliary cathode at the groove.

2. The method according to claim 1, wherein a width of the groove is 98% to 99% of a diameter of the negative thermal expandable ball.

3. The method according to claim 1, wherein a diameter of the negative thermal expandable ball is not more than twice a depth of the groove.

4. The method according to claim 3, wherein the diameter of the negative thermal expandable ball is 5 μm to 6 μm, and the depth of the groove is 2.5 μm to 3.5 μm.

5. The method according to claim 1, wherein an expansion coefficient of the negative thermal expandable ball is $(-0.8) \times 10^3$ to $(-1.3) \times 10^{-3} K^{-1}$.

6. The method according to claim 1, wherein the forming the light-emitting layer further comprises:
evaporating a light-emitting layer material at the side of the base substrate to form the light-emitting layer, wherein an evaporation temperature is not greater than 40° C.

7. The method according to claim 6, wherein the heating treatment comprises increasing an evaporation temperature to 90° C. to 100° C.

8. The method according to claim 1, wherein the vibrating treatment comprises a pressure blowing treatment or an ultrasonic vibrating treatment.

9. The method according to claim 1, wherein the groove is between two adjacent sub-pixel regions and a side wall of the groove is perpendicular to the base substrate, and a cross section of the groove in a direction perpendicular to the base substrate is a rectangle or square.

10. The method according to claim 1, wherein a non-pixel region is between adjacent sub-pixel regions on the base substrate, and the auxiliary cathode is at the non-pixel region.

11. The method according to claim 1, wherein the filling the negative thermal expandable ball into the groove further comprises: filling the negative thermal expandable ball into the groove by a dispensing method.

12. The method according to claim 1, wherein a material of the negative thermal expandable ball comprises a composite material of ceram and metal.

13. The method according to claim 1, wherein subsequent to the filling the negative thermal expandable ball into the groove and prior to the forming the light-emitting layer at the side of the base substrate, the method further comprises forming an anode layer at the sub-pixel regions of the base substrate.

14. The method according to claim 6, wherein prior to the evaporating the light-emitting layer material at the side of the base substrate, the method further comprises: turning over the base substrate provided with the negative thermal expandable ball.

15. The method according to claim 1, wherein the cathode layer is in direct contact with the auxiliary cathode at the groove, and the cathode layer is in direct contact with the pixel defining layer and the light-emitting layer.

* * * * *